United States Patent [19]

Hartman

[11] Patent Number: 4,548,862
[45] Date of Patent: Oct. 22, 1985

[54] FLEXIBLE TAPE HAVING BRIDGES OF ELECTRICALLY CONDUCTIVE PARTICLES EXTENDING ACROSS ITS PRESSURE-SENSITIVE ADHESIVE LAYER

[75] Inventor: Richard B. Hartman, St. Paul, Minn.

[73] Assignee: Minnesota Mining and Manufacturing Company, St. Paul, Minn.

[21] Appl. No.: 646,825

[22] Filed: Sep. 4, 1984

[51] Int. Cl.⁴ .................. B32B 3/00; B32B 15/00
[52] U.S. Cl. .................. 428/323; 174/117 A; 427/47; 427/128; 427/208.4; 428/328; 428/329; 428/356; 428/900; 428/906
[58] Field of Search .................. 174/88 R, 70 C, 94 R, 174/117 R, 117 A; 428/323, 328, 329, 356, 900, 906, 922, 195, 198, 204, 206, 208; 427/47, 128, 208.4

[56] References Cited

U.S. PATENT DOCUMENTS

| | | | |
|---|---|---|---|
| 3,132,204 | 5/1964 | Giellerup | 174/117 A |
| 3,359,145 | 12/1967 | Salyer et al. | 156/1 |
| 3,475,213 | 10/1969 | Stow | 428/328 |
| 3,762,946 | 10/1973 | Stow et al. | 428/356 |
| 4,113,981 | 9/1978 | Fujita et al. | 174/88 R |
| 4,258,100 | 3/1981 | Fujitani | 428/356 |
| 4,427,481 | 1/1984 | Smith et al. | 428/356 |
| 4,448,837 | 5/1984 | Ikeda et al. | 428/329 |

Primary Examiner—William J. Van Balen
Attorney, Agent, or Firm—Donald M. Sell; James A. Smith; Richard E. Brink

[57] ABSTRACT

Flexible tape having a pressure-sensitive adhesive layer containing particles, each particle having a ferromagnetic core and an electrically conductive surface. By virtue of the ferromagnetic cores, the particles can be magnetically attracted to form a large number of discrete electrically conductive bridges extending through the thickness of the adhesive layer. The tape can be used both to bond together and to electrically connect individual members of facing arrays of electrodes.

20 Claims, 1 Drawing Figure

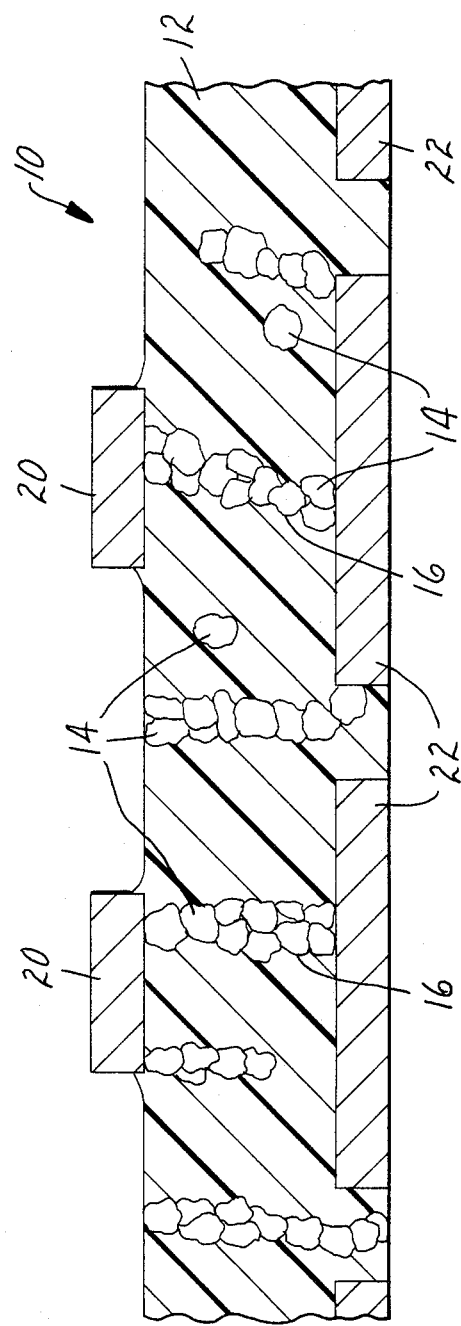

FLEXIBLE TAPE HAVING BRIDGES OF ELECTRICALLY CONDUCTIVE PARTICLES EXTENDING ACROSS ITS PRESSURE-SENSITIVE ADHESIVE LAYER

TECHNICAL FIELD

The invention concerns a pressure-sensitive adhesive tape, a layer of which contains electrically conductive particles affording conductive paths through the thickness of the layer for making electrical connections, such as between two arrays of electrical terminals.

BACKGROUND ART

Modern electronic devices are becoming so small and their electrical terminals are so delicate and closely spaced that it is difficult and expensive to make electrical connections by soldering or other established techniques. U.S. Pat. No. 4,113,981 (Fujita et al.) uses an adhesive layer for individually electrically interconnecting multiple pairs of arrayed electrodes. The adhesive layer includes spherical electrically conductive particles of substantially the same thickness as the adhesive, thus providing a conductive path through each particle that bridges facing pairs of electrodes. The particles are randomly distributed throughout the adhesive layer, but the Fujita patent indicates that if the particles comprise less than 30% by volume of the layer, they will be sufficiently spaced so that the intervening adhesive will insulate against short circuiting between laterally adjacent electrodes. Carbon powder, SiC powder and metal powder are said to be useful.

U.S. Pat. No. 3,475,213 (Stow) discloses a tape having an electrically conductive backing and a pressure-sensitive adhesive layer which contains a monolayer of electrically conductive particles that could be identical to the adhesive layer of the Fujita patent if Fujita were to use a pressure-sensitive adhesive.

The thickness of all electrically conductive particles used in each of the Fujita and the Stow patents should approximate the thickness of the adhesive layer. Smaller particles would not bridge facing electrodes whereas larger particles would reduce the adhesive contact. This problem is obviated in U.S. Pat. No. 3,762,946 (Stow et al.) by smaller electrically conductive particles of complex shape which are present in sufficient quantity to form numerous electrical bridges from one face of the adhesive to the other. However, the high proportion of conductive particles required for reliable bridging between narrow electrodes might engender a lateral conductivity that would prevent a single piece of tape from electrically connecting narrowly spaced pairs of electrodes without short-circuiting any adjacent electrodes.

U.S. Pat. No. 3,359,145 (Salyer et al.) makes electrically conductive adhesive connections by filling a hardenable organic adhesive with particles having ferromagnetic cores and electrically conductive surfaces. Two electrodes are joined by the adhesive while it is in a mobile state and, while the adhesive is hardening, a magnetic field is applied in the normal direction, thus aligning the particles to form conductive bridges between the electrodes. Preferred particles have an iron core coated with an electrically conductive metal such as silver which is more resistant to oxidation. Preferably the particles are elongated, and their lengths equal or slightly exceed the bond thickness. Any manufacturer of electrical equipment who wished to use Salyer's method to make electrical equipment would need to procure apparatus for creating a suitable magnetic field and to develop the capability of using that apparatus to position that field correctly. Also, special precautions would be necessary if the electrodes to be connected were part of a device which could be damaged by a strong magnetic field.

U.S. Pat. No. 3,132,204 (Giellerup) shows a pressure-sensitive adhesive tape wherein "one or more stripes 13 of electrically conductive material are laid over the upper face of the pressure-sensitive adhesive layer, as shown in FIG. 1 of the drawings, and the tape is then passed between a pair of pressure rollers which compact and flatten the stripes of metal foil (particles?) and the adhesive" (col. 2, lines 2–8).

DISCLOSURE OF THE INVENTION

The invention concerns a flexible tape that, like the adhesive layer of the Fujita patent, can adhesively make individual electrical connections between multiple pairs of electrode arrays without short circuiting electrodes of either array. However, the electrical conductivity through a layer of the novel tape is achieved by electrically conductive particles which are unlike those of the Fujita patent and instead are similar to those of the Salyer patent.

Briefly, the novel tape comprises a pressure-sensitive adhesive layer containing electrically conductive particles in an amount providing less than ten volume percent of the layer. Each of the particles of the novel tape has a ferromagnetic core and an electrically conductive surface. The maximum dimension of substantially every particle is less than the thickness of the pressure-sensitive adhesive layer. The particles together form a large number of discrete, electrically conductive bridges extending through the thickness of the layer, but the adhesive between individual bridges of the particles renders the layer laterally nonconductive, as are the adhesive layers of Fujita and Stow '213.

In contrast to problems mentioned above in using the method of the Salyer patent, the novel tape can be used to make electrical connections without need for special equipment or specially trained personnel.

A preferred method of making the novel tape comprises the sequential steps of:
(1) coating onto a flexible carrier web a mixture of low-viscosity photopolymerizable monomer and particles, each having a ferromagnetic core and an electrically conductive surface, the maximum dimension of substantially every particle being less than the ultimate thickness of the coating,
(2) then simultaneously
　(a) subjecting the coating to a magnetic field extending substantially orthogonally to the coating and of a strength sufficient to attract the particles to form a large number of discrete bridges, each extending through the thickness of the coating, and
　(b) polymerizing the monomer to fix the bridges of particles within a pressure-sensitive adhesive layer which is laterally nonconductive, and
(3) removing the tape from the magnetic field.

By virtue of their ferromagnetic cores, the particles are magnetically attracted by the field applied in step (2) to form a large number of discrete, electrically conductive bridges extending through the thickness of the adhesive layer. Because the bridges are separated by substantially particle-free regions, there is sufficient adhesive at the interface between the tape and each electrode substrate such that a bond between two arrays of electrodes should be substantially as strong as a bond provided by the same adhesive without any filler.

Preferably the carrier web is moved continuously through steps (1) and (2), and after step (3) is step (4) winding the tape upon itself in roll form. Manufacturers of electronic devices should find it far more convenient to unroll and dispense pieces of the tape to make electrical connections, as compared to the method taught in the Salyer patent.

By "low-viscosity photopolymerizable monomer" is meant a monomor having a viscosity of less than 40,000 cps and preferably at least 1000 cps. Useful monomers often initially have viscosities below 1000 cps, in which case they may be partially polymerized to a viscosity within the range of about 1000 to 40,000 cps before being mixed with the electrically-conductive particles and coated onto the flexible carrier web. Partial polymerization may either be carried out thermally or by ultraviolet radiation using a photoinitiator which is not a crosslinker such as 2,2-dimethoxy-2-phenyl acetophenone ("Irgacure" 651). Before photopolymerizing the particle-containing coating to a pressure-sensitive adhesive state, the coating preferably includes an agent by which it is crosslinked during photopolymerization, thus developing good resistance to heat and better assuring that the particle bridges remain intact during use. Some useful crosslinking agents also function as photopolymerization initiators such as 2,4-bis(trichloromethyl)-6-p-methoxystyryl-s-triazine. The chromophore-substituted halomethyl-s-triazines of U.S. Pat. Nos. 4,329,384 and 4,330,590 are especially useful where a high resistance to peelback is desired. Other useful photocrosslinkers are polyacrylic-functional monomers such as trimethylolpropane triacrylate; pentaerythritol tetraacrylate; 1,2-ethylene glycol diacrylate; 1,6-hexanediol diacrylate; and 1,12-dodecanediol diacrylate. Each of these photocrosslinkers is preferably used within the approximate range of 0.05 to 0.5 percent by weight of the polymerizable monomer.

The above-outlined method of making the novel tape by photopolymerization produces no volatile matter and also tends to provide higher adhesive values than can be achieved when coating adhesive polymers from solutions or emulsions. Also, it is believed to be more economical to maintain a magnetic field while the adhesive layer is being solidified by photopolymerization rather than while driving off volatile matter. Nevertheless, the adhesive layer of the novel tape can be coated from solution or emulsion and cured by conventional techniques, e.g., heat, electron beam, gamma radiation, or ionizing radiation.

Some block copolymers which are pressure-sensitive adhesives at ordinary room temperatures are of low viscosity when heated to moderately elevated temperatures such as 95° C. While being heated, these can be admixed with electrically conductive particles and then coated onto carrier webs and cooled in a magnetic field to provide tapes of the invention without evolving any volatile matter.

Economically, the magnetic field is created by a permanent magnet or a group of magnets positioned immediately beneath the carrier web. Useful low-cost permanent magnets comprise barium ferrite platelets dispersed in a rubber matrix, being available in large sheets so that photopolymerization of the adhesive layer can be carried out continuously while the carrier web travels along such a magnet sheet beneath a bank of ultraviolet lamps. Preferably such a magnet sheet is so magnetized that each of its faces has one magnetic pole.

Preferred electrically conductive particles have a nickel or iron core and a corrosion-resistant, electrically conductive coating, such as silver, copper or gold, which can be economically applied by electroless plating. An especially economical electrically conductive coating is aluminum. Useful but less preferred for the ferromagnetic core are materials such as barium ferrite which cannot readily be electrolessly plated and are preferably applied by a technique which may be more expensive, e.g., by sputtering or vapor deposition. Preferably, the weight ratio of a corrosion-resistant surface coating to a ferromagnetic core is about 30 to 70. Weight ratios less than about 10 to 90 may not provide adequate corrosion protection and conductivity, while weight ratios greater than about 50 to 50 may be economically wasteful, in silver content for example. For a further discussion of useful coated particles see U.S. Pat. No. 3,359,145. Also useful are nickel particles which have both a ferromagnetic core and an electrically conductive surface, but because nickel can oxidize and lose its surface conductivity, it preferably is coated with a more durable metal.

The cores of the electrically conductive particles may have any shape, e.g., spherical, acicular, or flake, and when coated, retain substantially the same shape. Preferably, the maximum dimension of every particle is less than the thickness of the pressure-sensitive adhesive layer to insure that no single particle acts as wedge to interfere with the adhesive bond between electrically connected electrodes. However, when the cores are barium ferrite platelets which have an easy axis of magnetization perpendicular to thin faces, the maximum dimensions to the particles could be substantially larger than the thickness of the adhesive layer without any particle acting as a wedge.

Spherical particles preferably average from about 5 to 15 micrometers in diameter. Flakes or platelets and acicular particles preferably are less than about 20 micrometers in their maximum dimensions.

It may be sufficient to use as little as 0.2 volume percent of the electrically conductive particles in the adhesive layer of the novel tape. Between 1 and 3 volume percent is preferred. To use more than 5 volume percent of the particles may be economically wasteful.

To make the novel tape laterally electrically conductive, the face of the carrier web to be coated may carry either a coextensive, electrically conductive layer or a plurality of spaced electrically conductive strips such as copper foil. Such spaced strips may be used to interconnect two separated arrays of electrodes, each electrical path extending through one or more bridges of particles between one electrode and the overlying electrically conductive strip and along the length of that strip to one or more bridges of particles at an electrode of the other array.

Especially useful as the photopolymerizable monomer are compositions comprising 50–100 parts of substituted or unsubstituted alkyl acrylate or methacrylate monomers (all of which are hereinafter sometimes collectively referred to as "acrylate monomer") and 0–50 parts of copolymerizable monoethylenically-substituted monomer. Preferred among these are copolymers of (1) 88–99 mol percent of alkyl acrylate having an average of 4–12 carbon atoms in their alkyl groups and (2) correspondingly, 12–1 mol percent of copolymerizable polar monomer such as acrylic acid, methacrylic acid, itaconic acid, acrylamide, and methacrylamide. The latter two are preferred because acids react with some electrically conductive particles. Other useful polar monoethylenically-unsaturated monomers which are copolymerizable with acrylate monomer include N-substituted acrylamides, acrylonitrile, methacrylonitrile, hydroxyalkyl acrylates, cyanoethyl acrylate, maleic anhydride, and N-vinyl-2-pyrrolidone, all of which result in pressure-sensitive adhesives which are tacky at ordinary room temperature when used with $C_{4-12}$ alkyl acrylate in amounts up to about 12 mol percent of the acrylate monomer, or up to about 50 mol percent when the copolymerizable monomer is mainly N-vinylpyrrolidone. Other copolymerizable monomers that should be useful include alkyl vinyl ethers, vinylidene chloride, styrene, and vinyltoluene.

The pressure-sensitive adhesive of the novel tape need not be tacky at room temperature if it becomes tacky upon being heated to moderately elevated temperatures. Such a pressure-sensitive adhesive may be obtained by using acrylate monomers having an average of only 1-3 carbon atoms or by copolymerizing acrylate monomers having longer alkyl groups with relatively large proportions of one or more of the aforementioned copolymerizable monomers. As compared to pressure-sensitive adhesive layers which are tacky at ordinary room temperatures, those which become tacky only when heated and are applied while tacky afford increased resistance to failures, both in shear and in peel, at both ordinary room temperatures and elevated temperatures.

THE DRAWING

In the drawing:

The single FIGURE is a schematic cross-section through two arrays of electrodes which are adhesively-bonded together and electrically connected to each other by a strip of tape of the invention.

The tape 10 comprises a layer of pressure-sensitive adhesive 12 containing electrically conductive particles 14 which together form a large number of bridges 16 extending through the thickness of the layer. Each of the particles 14 is a flake having a ferromagnetic core and an electrically conductive surface layer. A strip of the tape 10 adhesively bonds together facing arrays of electrodes 20 and 22, with some of the particle bridges 16 forming electrically conductive paths between facing pairs of the electrodes.

In the following examples, all parts are by weight unless otherwise indicated.

EXAMPLE 1

Silver was plated electrolessly onto spherical iron particles to a weight ratio of 25:75 silver:iron as follows. To a solution of 12.5 g of silver nitrate in 250 ml of distilled water was added dropwise approximately 16 ml of 28% ammonium hydroxide with stirring until the initially formed dark precipitate had just dissolved. This solution was then added to 25 g of reduced iron powder with stirring. To the resultant suspension was added a solution consisting of 8 g of anhydrous dextrose and 12.5 g of potassium hydroxide in 150 ml of distilled water. Stirring was continued for 3 minutes. The resulting light grey powder was filtered, washed well with distilled water, and dried overnight at 60° C. Mean diameter of the silver-coated particles was about 15 micrometers.

A mixture of 90 parts of isooctyl acrylate, 10 parts of acrylic acid and 0.04 part of photoinitator [2,2-dimethoxy-2-phenylacetophenone (available as "Irgacure" 651)] was partially photopolymerized to a syrup having a viscosity of 2000 centipoises. To 75 parts of this syrup was added 25 parts of the above silver-coated iron particles (2.75% by volume). To this was added 0.05 part of hexanediol diacrylate crosslinker and an additional 0.1 part of the "Irgacure" 651 photoinitiator followed immediately by coating between two silicone-treated transparent plastic films to a thickness of 50 micrometers. This was laid onto a number of flat, side-by-side permanent magnet strips, each about 15 cm long and 2 cm wide. Each permanent magnet strip had been magnetized to have a north pole at its upper face and a south pole at its lower face. With part of the coating above the magnets and part outside their magnetic field, the coating was exposed for 3 minutes to six 20-watt black fluorescent lights from a distance of 15 cm to photopolymerize the coating to a pressure-sensitive adhesive state.

Strips of tape were cut from the resulting sheet, each strip having a width of about one cm and a length of about 14 cm. A strip that was centered over one of the magnet strips is a tape of this invention and is here called "Example 1 Strip". Control 1 Strips were cut from a portion of the sheet which did not overlie a magnet.

EXAMPLE 2

A mixture of 76 parts of isooctyl acrylate, 20 parts of N-vinyl-2-pyrrolidone, 4 parts of acrylamide, and 0.04 part of "Irgacure" 651 photoinitiator was partially photopolymerized to a syrup having a viscosity of about 2000 centipoises. To 85 parts of this syrup was added 15 parts of flake-shaped silver-plated nickel particles (2% by volume) which had passed 400 mesh screen (37-micrometer openings). To this particle-filled syrup was added 0.05 part of hexanediol diacrylate crosslinker and an additional 0.1 part of the "Irgacure" 651 photoinitiator, followed immediately by coating between two silicone-treated transparent plastic films to a thickness of 50 micrometers. After this particle-filled syrup coating was magnetized and photopolymerized to a pressure-sensitive adhesive state as in Example 1, the resulting sheet was cut into strips as in Example 1 and called "Example 2 Strip" and "Control 2 Strip".

Microscopic examination of an Example 2 Strip obliquely through one of the silicone-treated plastic films at 10X magnification revealed that the flake-shaped silver-plated nickel particles had formed a large number of discrete bridges extending through the thickness of pressure-sensitive adhesive layer. The particles were oriented with their faces generally perpendicular to the layer. Portions of the layer between adjacent bridges had relatively few particles. This apparent migration of the conductive particles was evidenced by the Example 2 Strips being more transparent than the Control 2 Strips. Microscopic examination of one of the latter showed that its conductive particles were distributed quite uniformly, either as single particles or in small clumps which did not extend to both faces of the adhesive layer.

One Example 2 strip was used to bond together two arrays of electrodes as illustrated in the drawing. Each electrode of the first array had a width of 2.16 mm and was spaced from adjacent electrodes by 0.38 mm. Each electrode of the second array was centered over one of the first array, had a width of 0.25 mm, and was spaced from adjacent electrodes by 2.29 mm. There was good electrical conductivity between facing electrodes and no conductivity between adjacent electrodes of either array.

EXAMPLE 3

Ten grams of finely divided, electrically conductive nickel powder (flakes having a width of about 15 micrometers and a thickness of about 2 micrometers) were dispersed into a solution of 45 g of a rubbery styrene-butadiene-styrene block copolymer ("Kraton" 1107), 45 g of light mineral oil and 90 g of toluene. The dispersion was coated onto silicone-treated kraft paper. While part of the paper rested on the same set of magnet strips that were used in Example 1, the coating was allowed to dry to a pressure-sensitive adhesive state at ordinary room temperature for 3 hours. The thickness of the dried coating was about 50 micrometers.

Example 3 Strips and Control Strips were cut from the resulting sheet as in Example 2. Microscopic examination of an Example 3 Strip showed numerous discrete bridges of particles extending through the thickness of the adhesive layer.

Testing

When two electrodes, each about 1.2 cm square, were adhered to each other by one of Example 1, Example 2 or Example 3 Strip, electrical resistance through its adhesive layer was less than one ohm. Each Control Strip had substantially infinite resistance in the same test.

Each Example 1, 2 and 3 Strip exhibited shear strength and resistance to peel failure, equal to that of the corresponding Control Strip. This shows that by orienting the electrically conductive particles, adhesive performance values were not changed.

While a strip of a tape of the invention is primarily useful for making individual electrical connections between multiple pairs of electrodes such as illustrated in the drawing, the strip can be used both to adhere two large metal pieces together and to connect those pieces electrically, for example, in assembling an electrical shield. Where the surfaces of the pieces to be joined are uneven, a strip of a tape of the invention can be used on each face of an electrically conductive gasket for the same purpose, or the pressure-sensitive adhesive matrix of the novel tape may be a foam.

Thermally Conductive, Electrically Insulative Tape

A thermally conductive, electrically insulative tape is identical to the above-described tape except that in the surface of its particles are electrically insulative and thermally conductive. Such surfaces can be provided by oxides such as alumina, zirconia, zinc oxide and tin oxide. Such an electrically insulative tape is useful for such purposes as adhering an assemblage of electronic components to a single heat sink such as an aluminum casting formed with heat-dissipating fins or fingers. Since each particle has a ferromagnetic core, the particles can be magnetically attracted to form a large number of thermally conductive, electrically insulative bridges extending across the pressure-sensitive adhesive layer.

At the present time, a layer of silicone grease highly filled with thermally conductive particles such as alumina is used to conduct heat from an assemblage of electronic components to a heat sink, and a mechanical clamp is used to maintain contact. A thermally conductive, electrically insulative tape as described would eliminate the mechanical clamp and allow a pressure-sensitive adhesive to be used in place of relatively expensive silicone oil or grease. Although the oxide-coated ferromagnetic particles would be much more expensive than the alumina particles, this would in part be offset by the ability to use a relatively small proportion of the oxide-coated particles. Also, manufacturers of electronic assemblages would like very much to eliminate the trouble and expense of mechanical clamps.

I claim:

1. Flexible tape that can adhesively make individual electrical connections between multiple pairs of electrodes without short circuiting electrodes of either array, said tape comprising a pressure-sensitive adhesive layer containing electrically conductive particles in an amount providing less than ten percent by volume of the layer, each of the particles having a ferromagnetic core and an electrically conductive surface, the maximum dimension of substantially every particle being less than the thickness of the layer, the particles together forming a large number of discrete, electrically conductive bridges extending through the thickness of the layer, the adhesive between individual bridges rendering the layer laterally nonconductive.

2. Flexible tape as defined in claim 1 wherein said particles comprise from 0.2 to 5 volume percent of said layer.

3. Flexible adhesive tape as defined in claim 1 wherein most of the particles are flakes and are oriented with their faces generally perpendicular to the layer.

4. Flexible tape as defined in claim 1 wherein each particle has an electrically conductive coating over its ferromagnetic core.

5. Flexible tape as defined in claim 4 wherein the ferromagnetic core comprises nickel.

6. Flexible tape as defined in claim 6 wherein the coating comprises silver.

7. Flexible tape as defined in claim 1 wherein the pressure-sensitive adhesive is crosslinked.

8. Flexible tape as defined in claim 7 wherein said layer is supported by a disposable carrier web which has a low-adhesion surface in contact with the adhesive layer.

9. Flexible tape as defined in claim 1 wherein said layer is supported by a flexible, electrically insulative carrier web which carries a plurality of electrically conductive strips in contact with said layer.

10. Flexible tape as defined in claim 9 wherein each electrically conductive strip is a metal foil.

11. Flexible tape as defined in claim 9 wherein each electrically conductive strip is a thin film metal coating.

12. Flexible tape as defined in claim 1 wherein said layer is supported by a flexible, electrically insulative carrier web which carries a coextensive, electrically conductive layer in contact with said adhesive layer.

13. Method of making a flexible multiple-connector tape comprising the sequential steps of:
(1) coating onto a flexible carrier web a mixture of low-viscosity photopolymerizable monomer and particles, each particle having a ferromagnetic core and an electrically conductive surface, the maximum dimension of substantially every particle being less than the ultimate thickness of the coating,
(2) then simultaneously
(a) subjecting the coating to a magnetic field extending substantially orthogonally to the coating and of a strength sufficient to attract the particles to form a large number of discrete bridges, each extending through the thickness of the coating, and (b) polymerizing the monomer to fix the bridges of particles within a pressure-sensitive layer which is laterally nonconductive, and (3) removing the tape from the magnetic field.

14. Method as defined in claim 13 wherein the photopolymerizable monomer has been partially polymerized prior to Step (1) to a viscosity between 1000 and 40,000 cps.

15. Method as defined in claim 13 wherein said particles comprise from 0.2 to 5 volume percent of said photopolymerizable mixture.

16. Method as defined in claim 13 wherein the carrier web is moved continuously through Steps (1) and (2), and after Step (3) is Step (4) winding the tape upon itself in roll form.

17. Method as defined in claim 13 wherein the carrier web is a disposable film having a low-adhesion surface to which the coating is applied.

18. Method as defined in claim 13 wherein the carrier web is electrically insulative.

19. Method as defined in claim 18 wherein the face of the carrier web which is coated in Step 1 carries a plurality of electrically conductive strips.

20. Flexible tape that can adhesively bond an assemblage of electronic components to a heat sink to which heat from the assemblage can be carried off, said tape comprising a pressure-sensitive adhesive layer containing thermally conductive, electrically insulative particles in an amount providing less than ten percent by volume of the layer, each of the particles having a ferromagnetic core and an electrically insulative oxide surface, the maximum dimension of substantially every particle being less than the thickness of the layer, the particles together forming thermally conductive bridges extending through the thickness of the layer.

* * * * *